US008867509B2

(12) United States Patent
De Maaijer

(10) Patent No.: US 8,867,509 B2
(45) Date of Patent: Oct. 21, 2014

(54) INTEGRATED BLUETOOTH AND WIRELESS LAN TRANSMITTERS HAVING SIMULTANEOUS BLUETOOTH AND WIRELESS LAN TRANSMISSIONS

(75) Inventor: Luc De Maaijer, Belfeld (NL)

(73) Assignee: St-Ericsson SA, Plan-les-Ouates (CH)

( * ) Notice: Subject to any disclaimer, the term of this patent is extended or adjusted under 35 U.S.C. 154(b) by 140 days.

(21) Appl. No.: 13/106,147

(22) Filed: May 12, 2011

(65) Prior Publication Data
US 2012/0033656 A1 Feb. 9, 2012

Related U.S. Application Data

(60) Provisional application No. 61/370,895, filed on Aug. 5, 2010.

(51) Int. Cl.
H04W 4/00 (2009.01)
H03F 3/45 (2006.01)
H04B 1/40 (2006.01)
H03F 3/195 (2006.01)
H03F 3/21 (2006.01)
H03F 3/24 (2006.01)

(52) U.S. Cl.
CPC ............ H04B 1/406 (2013.01); H03F 2200/06 (2013.01); H03F 3/45183 (2013.01); H03F 3/195 (2013.01); H03F 2200/09 (2013.01); H03F 3/211 (2013.01); H03F 3/245 (2013.01)
USPC ........................................................ 370/338

(58) Field of Classification Search
CPC .................... H04W 72/1215; H04W 72/1257; H04W 72/0446; H04W 88/06; H04W 88/10; H04W 84/12; H04W 84/18; H04W 16/04
USPC ........................................................ 370/338
See application file for complete search history.

(56) References Cited

U.S. PATENT DOCUMENTS

| 2004/0071123 | A1  | 4/2004  | Shin |
| 2004/0224644 | A1* | 11/2004 | Wu et al. ................. 455/88 |
| 2007/0197256 | A1  | 8/2007  | Lu et al. |
| 2008/0139123 | A1* | 6/2008  | Lee et al. .............. 455/63.1 |
| 2008/0273552 | A1* | 11/2008 | Kim et al. .............. 370/468 |
| 2010/0197235 | A1* | 8/2010  | Wilhelmsson ........ 455/63.3 |

FOREIGN PATENT DOCUMENTS

EP 1 119 137 A1 7/2001

OTHER PUBLICATIONS

Wireless Performance Optimization Solutions: Bluetooth and 802.11 Coexistence, Author: Texas Instruments, Published: 2003. http://focus.ti.com/pdfs/vf/wireless/coexistence.pdf.*

(Continued)

Primary Examiner — Noel Beharry
(74) Attorney, Agent, or Firm — Patent Portfolio Builders PLLC

(57) ABSTRACT

Integrated Bluetooth (BT) and Wireless Local Area Network (WLAN) transceivers are described. BT signals and WLAN signals can be transmitted simultaneously with one another. Samples from a BT signal sample stream are injected into a WLAN signal sample stream. According to one exemplary embodiment, a simultaneously transmitted BT signal/WLAN signal can be amplified and coupled onto a pin of an integrated circuit device for transmission. If there is no WLAN signal to be transmitted when a BT signal is to be transmitted, then the BT signal can be processed in a BT section of the transceiver, amplified and coupled to the same pin for transmission.

15 Claims, 5 Drawing Sheets

(56) References Cited

OTHER PUBLICATIONS

International Search Report issued in corresponding International application No. PCT/EP2011/063480, date of mailing Nov. 8, 2011.

Written Opinion of the International Searching Authority issued in corresponding International application No. PCT/EP2011/063480, date of mailing Nov. 8, 2011.

* cited by examiner

INTEGRATED BLUETOOTH AND WIRELESS LAN TRANSMITTERS HAVING SIMULTANEOUS BLUETOOTH AND WIRELESS LAN TRANSMISSIONS

RELATED APPLICATION

This application is related to, and claims priority from, U.S. Provisional Patent Application No. 61/370,895, entitled "Integrated Bluetooth and Wireless LAN Transceivers", filed on Aug. 5, 2010, the disclosure of which is incorporated here by reference.

TECHNICAL FIELD

The present invention relates generally to communications systems, devices and methods and, in particular, to integrated Bluetooth and WLAN transceivers.

BACKGROUND

As technology advances, the options for communications have become more varied. For example, in the last 30 years in the telecommunications industry, personal communications have evolved from a home having a single rotary dial telephone, to a home having multiple telephone, cable and/or fiber optic lines that accommodate both voice and data. Additionally cellular phones and wireless networking technologies have added a mobile element to communications. In terms of wireless networking communications, two of the currently dominant, standardized approaches are specified in the Wireless LAN (WLAN, "Wi-Fi", 802.11a/b/g/n) standard and the Bluetooth standard.

WLAN devices are frequently used, for example, to provide wireless Internet connectivity and operate in two frequency bands, i.e., a low band disposed in the 2.4 GHz Industrial, Scientific and Medical Band (ISM band) and a high band disposed in the 5 GHz range. Bluetooth devices also operate in the 2.4 GHz band and are frequently used, for example, for short range wireless communications, e.g., between a mobile phone and an associated earbud device.

Increasingly, WLAN devices and Bluetooth devices operate in proximity to one another and, recently, there has been an interest in providing integrated WLAN/Bluetooth transceivers. This raises various co-existence challenges associated with the different standardized radio interfaces, as well as other challenges associated with, for example, reducing pin and component counts as described in more detail below.

SUMMARY

Integrated Bluetooth (BT) and Wireless Local Area Network (WLAN) transceivers are described. BT signals and WLAN signals can be transmitted simultaneously with one another. Samples from a BT signal sample stream are injected into a WLAN signal sample stream. According to one exemplary embodiment, a simultaneously transmitted BT signal/WLAN signal can be amplified and coupled onto a pin of an integrated circuit device for transmission. If there is no WLAN signal to be transmitted when a BT signal is to be transmitted, then the BT signal can be processed in a BT section of the transceiver, amplified and coupled to the same pin for transmission and vice versa.

According to an exemplary embodiment, a device includes a first air interface transmitter section configured to transmit a first air interface signal, a second air interface transmitter section configured to transmit a second air interface signal, and an interface between the first air interface transmitter section and the second air interface transmitter section, the interface configured to add signal samples associated with the first air interface signal into a signal sample stream associated with said second air interface signal, wherein the first air interface signal and the second air interface signal are transmitted simultaneously via the second air interface transmitter.

According to another exemplary embodiment, a method for transmitting signals includes the steps of: generating a sample stream including signal samples associated with a first air interface signal to be transmitted and signal samples associated with a second air interface signal to be transmitted, converting the sample stream to an analog signal, amplifying the analog signal, and transmitting the analog signal to simultaneously transmit the first air interface signal and the second air interface signal.

BRIEF DESCRIPTION OF THE DRAWINGS

The accompanying drawings illustrate exemplary embodiments, wherein.

ACRONYM LIST

ADC Analog-To-Digital Converter
BT Bluetooth
DAC Digital-To-Analog Converter
HB High Band
LB Low Band
LNA Low Noise Amplifier
LO Local Oscillator
PA Power Amplifier
RF Radio Frequency
SOC System On Chip
WLAN Wireless Local Area Network

DETAILED DESCRIPTION

The following detailed description of the exemplary embodiments refers to the accompanying drawings. The same reference numbers in different drawings identify the same or similar elements. Also, the following detailed description does not limit the invention. Instead, the scope of the invention is defined by the appended claims.

Figure 1:
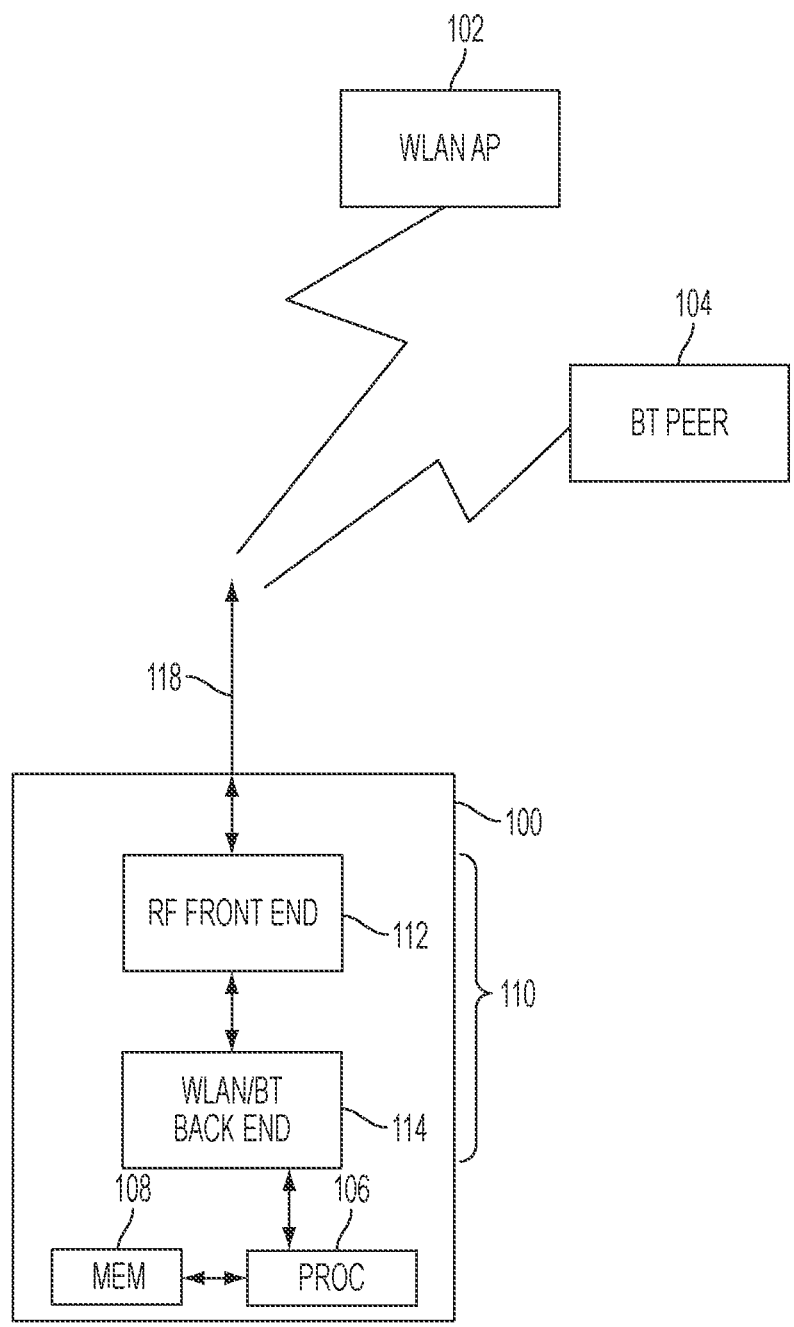
FIG. 1 illustrates a communication system according to an exemplary embodiment.

In order to provide some context for this discussion, FIG. 1 illustrates an exemplary electronic device 100 which is capable of communicating with both WLAN devices, e.g., represented by WLAN access point (AP) 102, and BT devices, e.g., represented by BT peer 104. The exemplary electronic device 100 includes a processor 106 which is connected to a memory device 108, and which controls a combined WLAN/BT transceiver 110. The WLAN/BT transceiver 110 can be characterized as including an RF front end 112 and a WLAN/BT back end 114 (the latter of which is sometimes also referred to as a system-on-chip (SOC)).

As will be described in more detail below, the RF front end 112 is generally responsible, for example, for tasks such as up and down conversion, filtering and amplification of signals which have been received or are to be transmitted by electronic device 100, while the WLAN/BT back end 114 is generally responsible, for example, for tasks such as modulation/demodulation and coding/decoding of signals to be transmitted or which have been received, respectively. The RF front end 112 and WLAN/BT back end may be integrated into a system on chip (SOC), an integrated circuit (IC) such as an application specific IC (ASIC), or may be provided as two separate chips. The RF front end 112 is connected to one or more antennas 118, which may take any form, e.g., printed or embedded in a housing of the electronic device 100, extending or extensible therefrom, etc.

Figure 2:
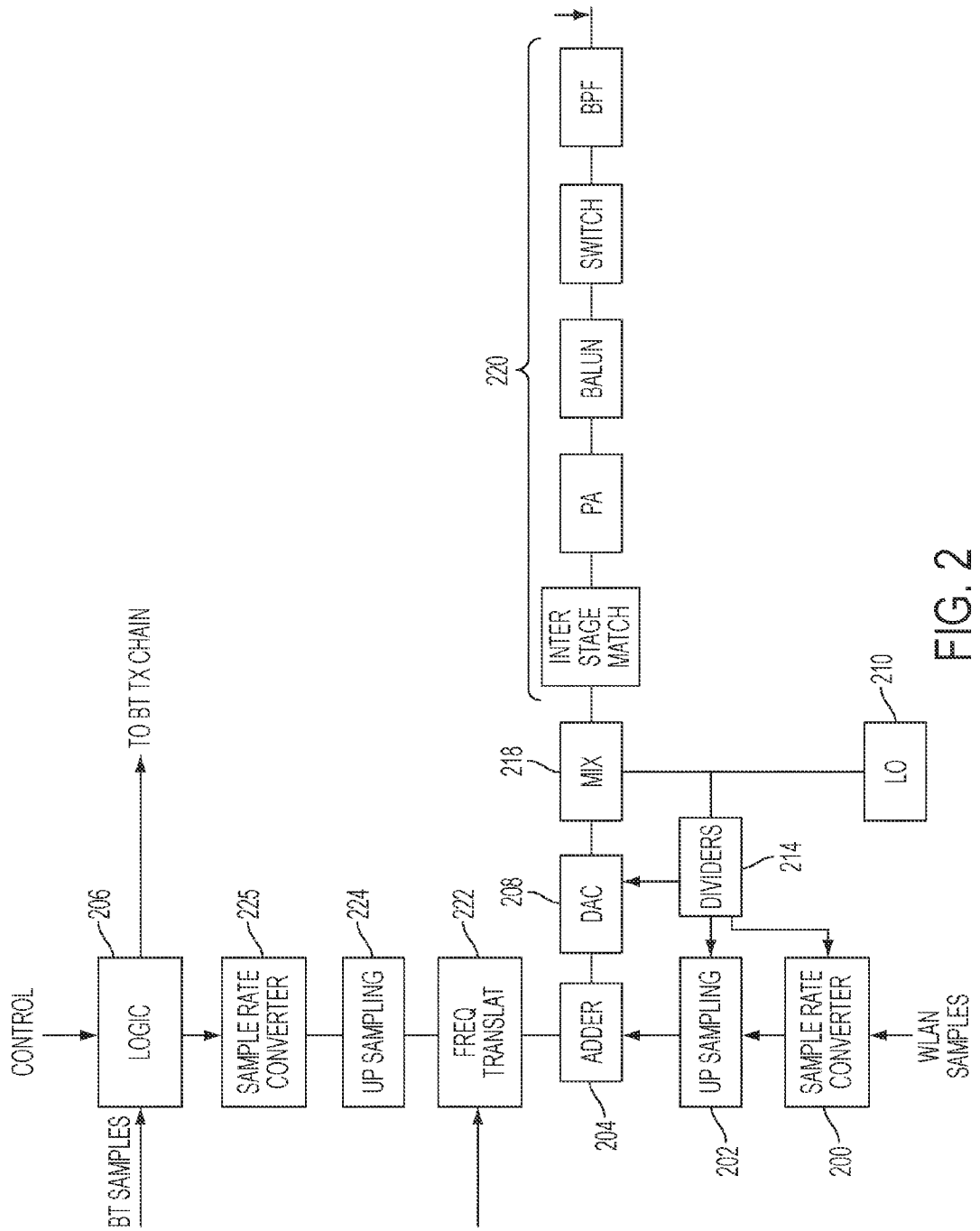
FIG. 2 illustrates a portion of an exemplary WLAN/BT transceiver on a chip according to an exemplary embodiment.

A detailed example of a simultaneous BT and WLAN transmission embodiment is illustrated in FIG. 2. Considering first the WLAN side digital WLAN signal samples are input to sample rate converter 200, which converts the rate of those samples in preparation for upsampling at block 202. The upsampled WLAN signal samples are input to adder 204, where they can be added to BT signal samples as described below.

To determine whether to send the BT signal samples to the WLAN transmit chain (i.e., when simultaneous transmission is occurring) or, alternately, to send the BT signal through the BT transmit chain (i.e., when no WLAN LB signal is to be transmitted simultaneously), logic 206 can be provided. An example is shown in FIG. 2, wherein a logic block 206, e.g., a multiplexer, receives a control signal (simultaneous TX/No simultaneous TX) and switches the BT signal samples either toward the adder 204 or toward the dedicated BT transmit chain, based on receiving the respective control input. The BT transmit chain can be implemented in any desired manner and is not further described here.

Figure 3:
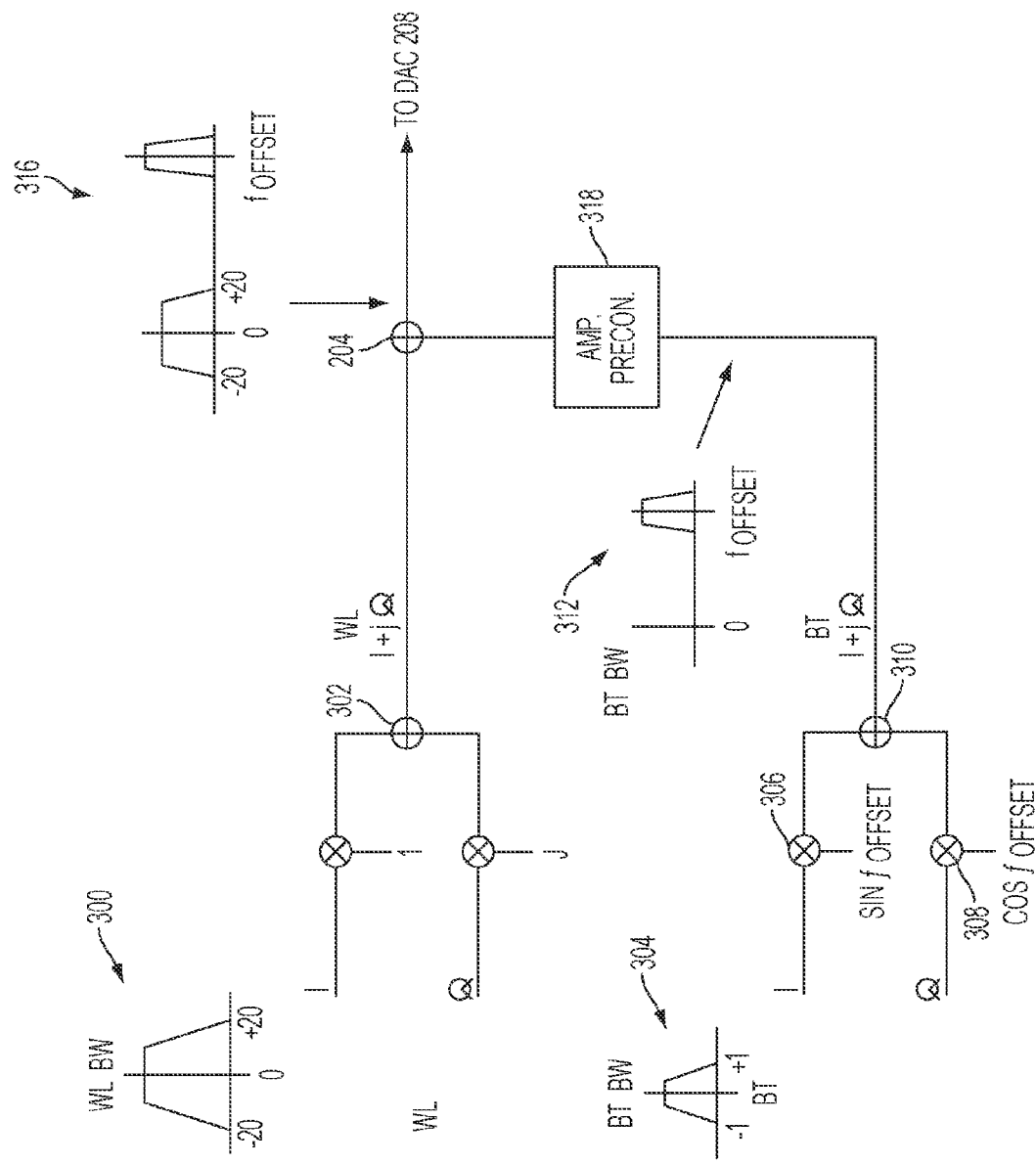
FIG. 3 shows a WLAN transmit processing chain including BT signal sample injection according to an exemplary embodiment.

If, however, the logic block 206 directs the BT samples toward the WLAN transmit chain, then the BT samples are sample rate converted, upsampled and frequency translated in blocks 225, 224 and 222, respectively. One or more of the blocks 206, 222, 224 and 225 can be considered to be an interface between the WLAN transmitter section and the BT transmitter section, the interface being configured to add signal samples associated with the BT signal into a signal sample stream associated with the WLAN signal. One exemplary mechanism for performing the frequency translation of the BT sample stream and addition to the WLAN sample stream is shown in FIG. 3.

Therein, an exemplary WLAN signal having a frequency bandwidth 300 of 40 MHz is shown, although it will be appreciated that this bandwidth value is purely illustrative and could be any desired bandwidth. This exemplary WLAN sample stream can be formed as the sum of I and Q signals which are (complex) added together at adder 302 to form a WLAN I+jQ sample of a first number of bits. In the lower part of FIG. 3, an exemplary BT signal has a frequency bandwidth 304 of 2 MHz, which value again is purely illustrative. The incoming I and Q signals are digitally multiplied, at multipliers 306 and 308, respectively, with an offset frequency. The offset frequency can, for example, be selected to be the difference between the BT signal's hopping frequency and the WLAN channel frequency up to some maximum value, e.g., 80 MHz. Although illustrated as being digitally mixed with sine and cosine of the offset frequency, since the operation is digital, an oversampled square wave approximation of the sine and cosine functions can be used as inputs to the mixers 306 and 308, respectively. The outputs are then summed at adder 310 to generate the BT I+jQ sample having a second number of bits and now shifted in the frequency domain as shown by 312.

The BT signal and the WLAN signal are then added together in adder 304 to generate a combined WLAN/BT signal having the WLAN portion centered about an IF frequency and the BT portion shifted outside of the WLAN bandwidth, e.g., as shown in graph 316. The first number of bits associated with the WLAN sample I+jQ and the second number of bits associated with the BT sample may be different. If so, it may also be desirable to include an amplitude preconditioning function 318 in order to avoid power imbalances between the WLAN portion of the signal and the BT portion of the signal, e.g., to precondition the amplitude of the BT portion of the signal based on the difference (if any) between the number of bits in the two samples.

Returning to FIG. 2, adder 204 can thus add the in-frequency translated BT signal samples from block 222 with the upsampled WLAN signals from block 602 so that, after digital-to-analog (DAC) conversion 208, the WLAN signals are centered around the IF frequency and the BT signals are spaced outside the WLAN IF signal. The BT/WLAN simultaneous transmission signal is digitized and upconverted in DAC 208, which has a high oversampling rate, e.g., sufficient to allow signals having a spacing of approximately 100 MHz to pass, caused by clocking the DAC 208 at a significantly high frequency, e.g., 200 MHz and higher. After digital to analog conversion, the signal is optionally upconverted in mixer 218.

Clock signals are provided by local oscillator 210 and dividers 214 to, for example, the sample rate converter 200 (and 225), the upsampler 202 (and 224), as well as to the DAC 208 to provide suitable clocking of these elements. Once the simultaneous BT/WLAN signal has been finally upconverted at mixer 218, it can be passed through other elements 220 in the transmit chain prior to being coupled to an antenna 222 and transmitted. These other elements 220 can include, for example, an interstage matching circuit, a power amplifier (PA), a balun (or a pair of series switched baluns), a switch (e.g., to switch in either the BT transmit chain or the simultaneous BT/WLAN transmit chain to the antenna) and a bandpass filter (BPF).

Figure 4:
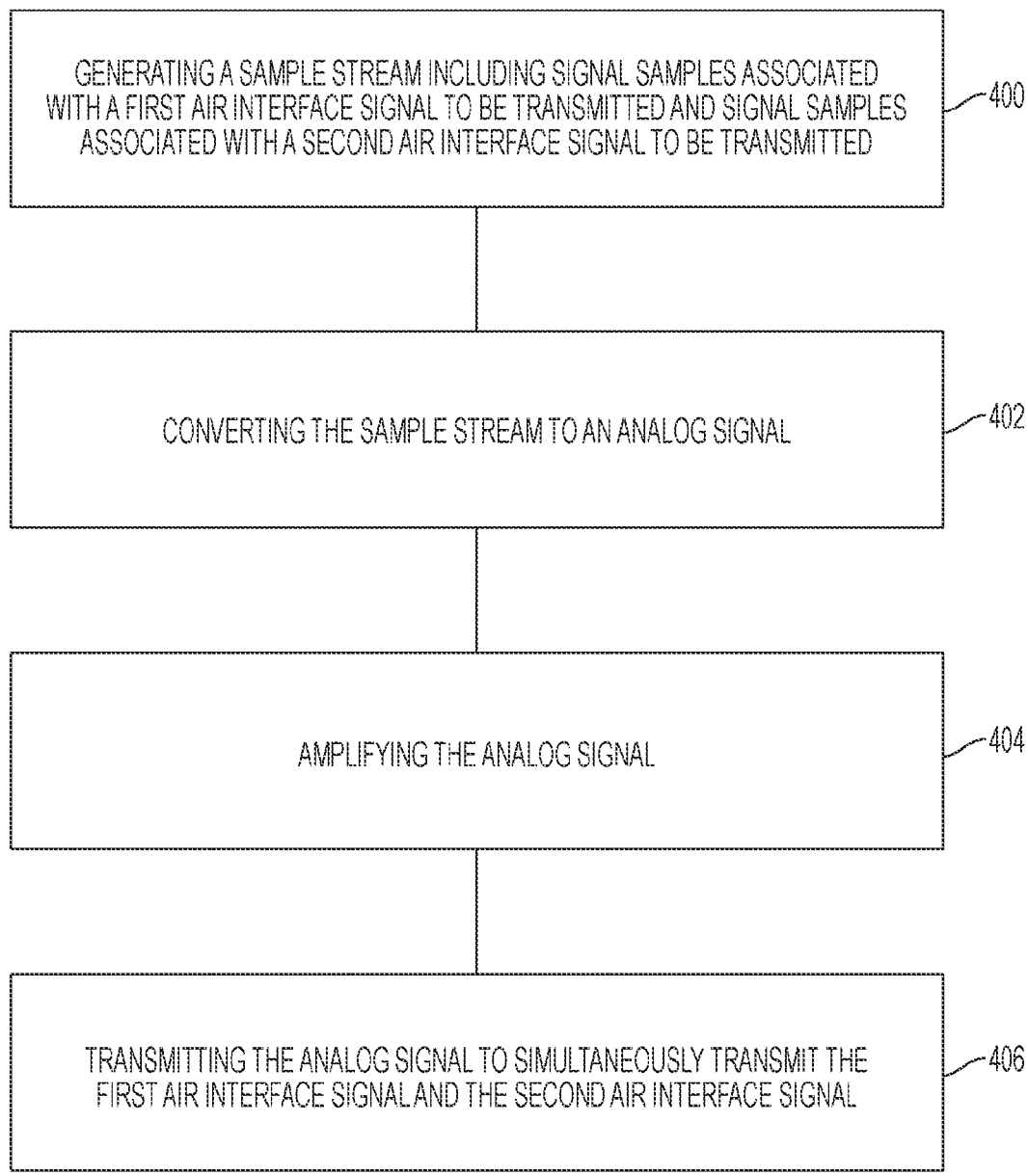
FIG. 4 is a flowchart depicting a method of transmitting BT and WLAN signals simultaneously according to an exemplary embodiment.

Although described above with respect to WLAN and BT signals, exemplary embodiments can more generally be referred to as simultaneously transmitting signals associated with two different air interfaces, e.g., WLAN and Long Term Evolution (LTE). Thus, according to one exemplary embodiment, a method for transmitting signals includes the steps illustrated in the flowchart of FIG. 4. At step 400, a sample stream is generated including signal samples associated with a first air interface, e.g., WLAN, signal to be transmitted and signal samples associated with a second air interface, e.g., BT, signal to be transmitted. The sample stream is converted to an analog signal at step 402, and amplified at step 404. The resulting amplified analog signal is then transmitted at step 406, to realize a simultaneously transmitted first air interface signal and second air interface signal.

Figure 5:
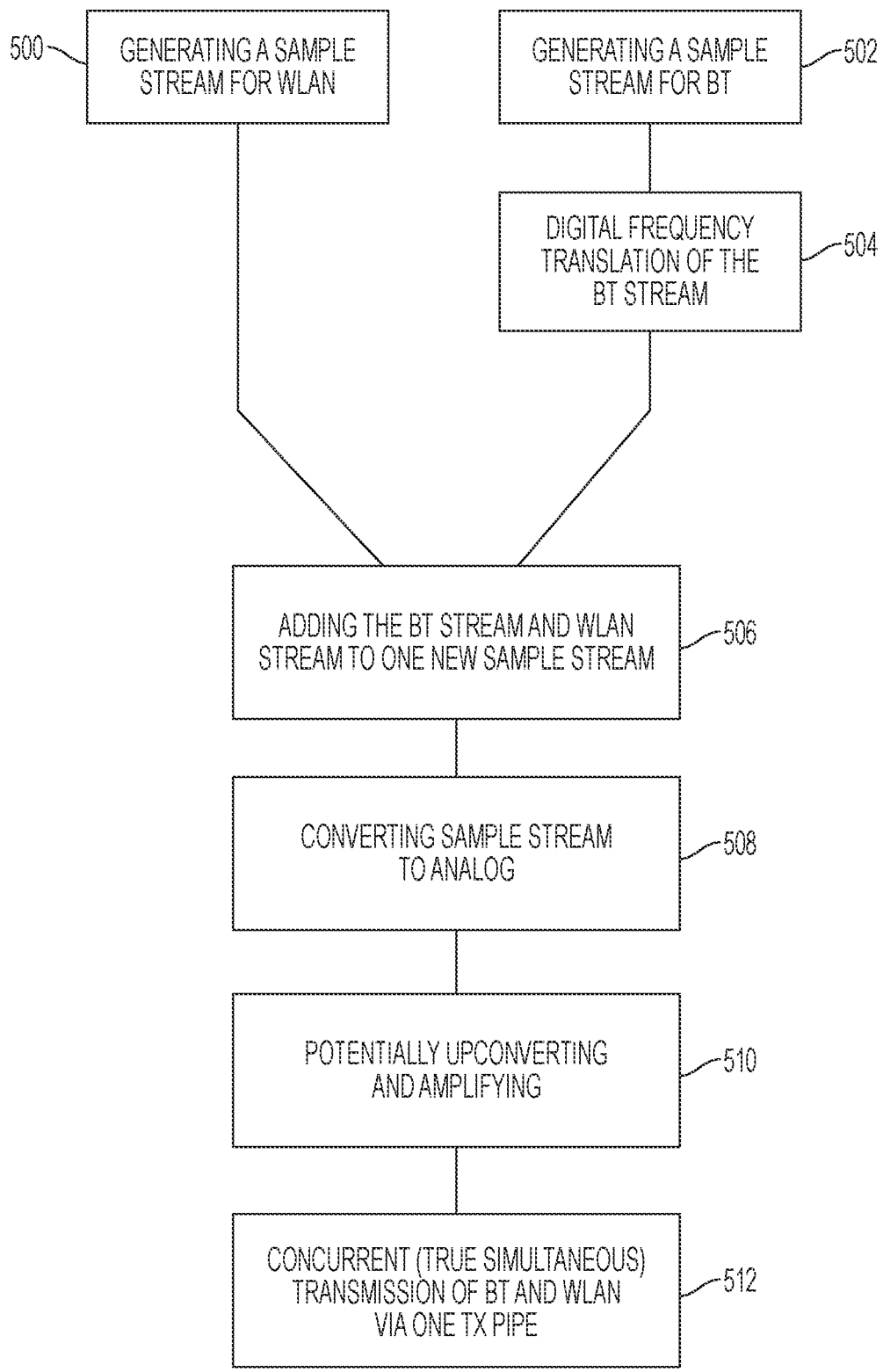
FIG. 5 is a flowchart depicting a method of transmitting BT and WLAN signals simultaneously according to another exemplary embodiment.

According to another embodiment, a method for transmitting signals can include the steps illustrated in the flowchart of FIG. 5. Therein a sample stream is generated for a WLAN signal at step 500. At substantially the same time, a sample stream is generated for a BT signal at step 502. The BT sample stream is digitally, frequency translated at step 504, and then the BT sample stream and WLAN sample stream are added together at step 506. The combined sample stream is converted from digital to analog at step 508 and, optionally, upconverted and amplified at step 510. The resulting signal is then a concurrent or simultaneous transmission of BT and WLAN information via a single transmit pipe as indicated by step 512.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

The invention claimed is:

1. A device comprising:
   a first air interface transmitter section configured to transmit a first air interface signal;
   a second air interface transmitter section configured to transmit a second air interface signal; and
   an interface between said first air interface transmitter section and said second air interface transmitter section, said interface configured to add signal samples associated with said first air interface signal into a signal sample stream associated with said second air interface signal, wherein said first air interface signal and said second air interface signal are transmitted and multiplexed simultaneously via said second air interface transmitter, and
   wherein said interface includes a frequency translation module configured to modify a frequency associated with said signal samples associated with said first air interface signal prior to injecting said signal samples associated with said first air interface signal into said signal sample stream associated with said second air interface signal,
   wherein said frequency translation module is configured to operate such that the second air interface signal is centered around an intermediate (IF) frequency and the first air interface signal is spaced in frequency outside the second air interface signal.

2. The device of claim 1, wherein the interface further comprises:
   logic configured to determine whether said first air interface signal is to be transmitted simultaneously with said second air interface signal, wherein if said first air interface signal is to be transmitted simultaneously with said second air interface signal, then said signal samples associated with said first air interface signal are sent to said interface.

3. The device of claim 1, wherein if said first air interface signal is to be transmitted without a simultaneous second air interface signal, said logic is further configured to send said signal samples associated with said first air interface signal for transmission in said first air interface transmitter section.

4. The device of claim 1, wherein said device is implemented as an integrated circuit.

5. The device of claim 1, wherein said first air interface transmitter section is a BLUETOOTH (BT) transmitter section, said second air interface transmitter is a Wireless Local Area Network (WLAN) transmitter section, said first air interface signal is a BT signal, and said second air interface signal is a WLAN signal.

6. The device of claim 1, wherein said first air interface transmitter section is a Long Term Evolution (LTE) transmitter section, said second air interface transmitter is a Wireless Local Area Network (WLAN) transmitter section, said first air interface signal is an LTE signal, and said second air interface signal is a WLAN signal.

7. The device of claim 1, further comprising:
   an amplitude pre-conditioner configured to pre-condition an amplitude of said first air interface signal based on a difference in a number of bits of said first and second air interface signals.

8. A method for transmitting signals comprising:
   generating a sample stream including signal samples associated with a first air interface signal to be transmitted and signal samples associated with a second air interface signal to be transmitted;
   converting said sample stream to an analog signal;
   amplifying said analog signal; and
   multiplexing and transmitting said analog signal to simultaneously transmit said first air interface signal and said second air interface signal, and wherein,
   said step of generating includes modifying a frequency associated with said signal samples associated with said first air interface signal prior to injecting said signal samples associated with said first air interface signal into said signal sample stream associated with said second air interface signal,
   wherein said second air interface signal is centered around an intermediate (IF) frequency and the first air interface signal is spaced in frequency outside the second air interface signal.

9. The method of claim 8, further comprising:
   determining whether said first air interface signal is to be transmitted simultaneously with said second air interface signal, if said first air interface signal is to be transmitted simultaneously with said second air interface signal, then sending said signal samples associated with said first air interface signal to an interface to generate said sample stream.

10. The method of claim 9, further comprising:
    if said first air interface signal is to be transmitted without a simultaneous second air interface signal, sending said signal samples associated with said first air interface signal for transmission in a first air interface transmitter section.

11. The method of claim 8, wherein said first air interface signal is a BLUETOOTH (BT) signal and said second air interface signal is a Wireless Local Area Network (WLAN) signal.

12. The method of claim 8, wherein said first air interface signal is a Long Term Evolution (LTE) signal and said second air interface signal is a Wireless Local Area Network (WLAN) signal.

13. The device of claim 7, wherein said amplitude pre-conditioner is further configured to substantially prevent power imbalances between said first and second air interface signals during transmission of said first and second air interface signals.

14. The method of claim 8, further comprising:
    pre-conditioning an amplitude of said first air interface signal based on a difference in a number of bits of said first and second air interface signals.

15. The method of claim 14, further comprising:
    substantially preventing power imbalances between said first and second air interface signals during transmission of said first and second air interface signals.

* * * * *